United States Patent
Lee et al.

(10) Patent No.: US 7,154,235 B2
(45) Date of Patent: Dec. 26, 2006

(54) ORGANIC ELECTROLUMINESCENT DEVICE HAVING SOLAR CELLS

(75) Inventors: Jiun-Haw Lee, Taipei (TW); Ting-Wei Chuang, Tainan County (TW); Chih-Chien Lee, Taoyuan County (TW); Peir-Jy Hu, Hsinchu (TW)

(73) Assignee: RiTdisplay Corporation, Hsinchu (TW)

( * ) Notice: Subject to any disclaimer, the term of this patent is extended or adjusted under 35 U.S.C. 154(b) by 374 days.

(21) Appl. No.: 10/707,356

(22) Filed: Dec. 8, 2003

(65) Prior Publication Data

US 2004/0119401 A1    Jun. 24, 2004

(51) Int. Cl.
*H05H 11/00* (2006.01)
(52) U.S. Cl. .................. 315/504; 29/592.1; 29/832; 250/208.1; 250/553; 257/40; 315/169.3; 315/169.4; 345/205; 345/207
(58) Field of Classification Search .............. 29/592.1, 29/832; 250/208.1, 553; 257/40; 315/169.3, 315/169.4, 504; 345/205, 207
See application file for complete search history.

(56) References Cited

U.S. PATENT DOCUMENTS

| | | | | |
|---|---|---|---|---|
| 5,504,323 | A | * | 4/1996 | Heeger et al. ........... 250/214.1 |
| 6,023,073 | A | * | 2/2000 | Strite ......................... 257/40 |
| 6,441,560 | B1 | * | 8/2002 | Hunter ..................... 315/169.1 |
| 6,774,578 | B1 | * | 8/2004 | Tanada ..................... 315/169.4 |

OTHER PUBLICATIONS

"Energy level alignment at organic/metal interfaces studied by UV photoemission: breakdown of traditional assumption of a common vacuum level at the interface"; Ishii, H.; Seki, K.; Electron Devices, IEEE Transactions on vol. 44, Issue 8; Aug. 1997; pp. 1295-1301.*

* cited by examiner

*Primary Examiner*—Paul D. Kim
(74) *Attorney, Agent, or Firm*—Jianq Chyun IP Office

(57) ABSTRACT

An organic electroluminescent device having solar cells and a fabricating method therefor are disclosed. The device comprises a transparent substrate; an organic electroluminescent device on the transparent substrate; and at least one solar cells on the transparent substrate. Besides, the device further comprises a driving unit coupled to the organic electroluminescent device; a transform unit coupled to the solar cells; and a control unit coupled to the driving unit and the transform unit.

10 Claims, 1 Drawing Sheet

ORGANIC ELECTROLUMINESCENT DEVICE HAVING SOLAR CELLS

BACKGROUND OF INVENTION

1. Field of the Invention

The present invention relates to an organic electroluminescent device and a fabricating method therefor, and more particularly to an organic electroluminescent device having solar cells therein and a fabricating method for integrating the organic electroluminescent device and solar cells.

2. Description of the Related Art

Computer, communication and consumer products have become the main trend of high technology. Portable electronic devices are also the essential products of development. Of course, displays are also included. Today, the displays include Plasma Display Panel (PDP), Liquid Crystal Display (LCD), Electro-luminescent Display, Light Emitting Diode Display, Vacuum Fluorescent Display, Field Emission Display (FED) and Electro-chromic Display.

Compared with these displays, the organic electroluminescent display, however, has advantages of self-luminescence, wide viewing angle, high resolution, low power consumption, easy manufacturing process, low costs, low operational temperature, fast response speed, low driving voltage, etc. It has potential application and can become the main trend for the next generation displays.

An organic electroluminescent device uses an organic electroluminescent material serving for display, which is composed of a pair of electrodes and an organic electroluminescent layer. When a current is applied to the device, electrons and holes recombine within the organic electroluminescent layer and generate photons. Therefore, light having different colors accordingly is depending on the material property of the organic electroluminescent layer.

However, when a display is stand-by, it still consumes the power. Therefore, how to extend dischargetime of battery of the organic electroluminescent display is an essential issue that should be resolved.

SUMMARY OF INVENTION

Therefore, the object of the present invention is to provide an organicelectroluminescent device having solar cells and a fabricating method therefor by which the solar cells transform light into electrical energy for display.

The present invention discloses an organic electroluminescent device having solar cells, which comprises a transparent substrate, an organic luminescent device, at least one solar cell, a driving unit, a transform unit and a control unit. The transparent substrate has anelectroluminescent area and an exposure area. The organic electroluminescent device is disposed within the electroluminescent area of the transparent substrate. The organic electroluminescent device comprises a transparent anode disposed on the transparent substrate, an organic electroluminescent layer disposed on the transparent anode and a metal cathode disposed on the organic electroluminescent layer. The solar cell is disposed within the exposure area of the transparent substrate, wherein the solar cell comprises a transparent cathode disposed on the transparent substrate, a electroluminescent layer disposed on the transparent cathode and a metal anode disposed on the electroluminescent layer. In addition, the present invention further comprises a driving unit, a transform unit and a control unit. The driving unit is coupled to the organic electroluminescent device, the transform unit is coupled to the solar cell and the control unit is coupled to the driving unit and the transform unit. When the solar cell is exposed to light, it can transform the light into electrical energy. Then, the transform unit coupled to the solar cell can transport the electrical energy to the control unit. The control unit passes the electrical energy to the driving unit for electroluminescence.

The present invention also discloses a method for fabricating an organic electroluminescent device having solar cells. The method first provides a transparent substrate having anelectroluminescent area and an exposure area. An organic electroluminescent device is formed within the electroluminescent area of the transparent substrate and at least one solar cell is formed within the exposure area of the transparent substrate. The method of forming the organic electroluminescent device and the solar cell on the transparent substrate comprises forming a patterned transparent anode and a patterned transparent cathode on the transparent substrate; forming an organic electroluminescent layer on the transparent anode and a electroluminescent layer on the transparent cathode; and forming a metal cathode on the organicelectroluminescent layer and a metal anode on the electroluminescent layer for forming the organic electroluminescent device and the solar cell. The organic electroluminescent device is coupled to a driving unit, the solar cell is coupled to a transform unit and the driving unit and the transformunit are coupled to a control unit. When the solar cell is exposed to light, it can transform the light into electrical energy. Then, the transform unit coupled to the solar cell can transport the electrical energy to the control unit. The control unit passes the electrical energy to the driving unit for electroluminescence.

The organic electroluminescent device having solar cells and the fabricating method therefor of the present invention integrate the organic electroluminescent device and solar cells. Because the organic electroluminescent device has the process and material similar to those of the solar cells, the present invention simplifies the manufacturing process and reduces costs thereof. Moreover, because of the assistance of the solar cells, the discharge time of battery of organic electroluminescent display is increased.

In order to make the aforementioned and other objects, features and advantages of the present invention understandable, a preferred embodiment accompanied with figures is described in detail below.

DETAILED DESCRIPTION

Figure 1:
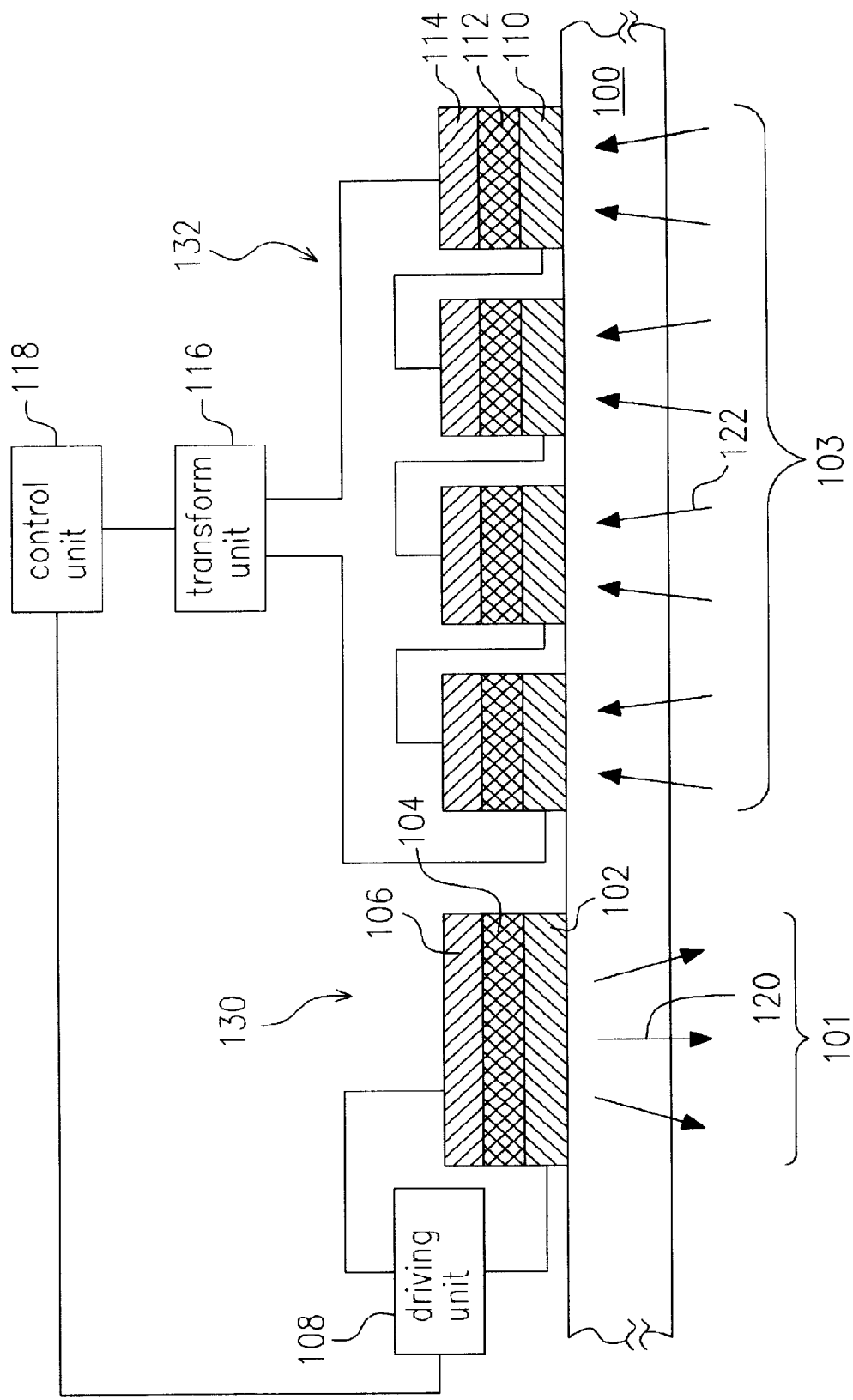
FIG. 1 is a schematic cross-sectional drawing showing a preferred organic electroluminescent device having solar cells in accordance with the present invention.

FIG. 1 is a schematic cross-sectional drawing showing a preferred organic electroluminescent device having solar cells in accordance with the present invention.

Please referring to FIG. 1, the organic electroluminescent device having solar cells of the present invention comprises a transparent substrate 100, an organic electroluminescent device 130, at least one solar cell 132, a driving unit 108, a transform unit 116 and a control unit 118.

The transparent substrate 100 has anelectroluminescent area 101 and an exposure area 103. The organic electroluminescent device 130 is disposed within the electroluminescent area 101 of the transparent substrate 100. The organic electroluminescent device 130 comprises, in sequence, a transparent anode 102, an organic electroluminescent layer 104 and a metal cathode 106. In this embodiment, the transparent anode 102 is, for example, indium-tin oxide or indium-zinc oxide. The metal cathode 106 is, for example, aluminum, aluminum/lithium fluorine, calcium, magnesium/silver alloy or silver. The organic electroluminescent layer 104 comprises a hole injection layer (not show), a hole transporting layer (not show), a light-emitting layer (not show), an electron transporting layer (not show) and an electron injection layer (not show). The organic electroluminescent layer is, for example, an small molecular organic electroluminescent material or a polymer electroluminescent material.

In addition, the solar cell 132 is disposed within the exposure area 103 on the transparent substrate 100, and the number of the solar cell 132 on the transparent substrate 100 is at least one. This embodiment shown in FIG. 1, four series solar cells are used, but not limited thereto.

Please referring to FIG. 1, the series solar cell 132 is on the transparent substrate 100, wherein the solar cell 132 comprises, in sequence, a transparent cathode 110, anelectroluminescent layer 112 and a metal anode 114. In this embodiment, the transparent cathode 110 is transparent material, such as indium-tin oxide or indium-zinc oxide. Therefore, light 122 enters into the solar cell 132. The metal anode 114 is, for example, aluminum, aluminum/lithium fluorine, calcium, magnesium/silver alloy or silver. The electroluminescent layer 112 can be an organic material or an inorganic material.

In the present invention, the method the forming the organic electroluminescent device 130 and the solar cell 132 on the transparent substrate 100 comprises forming a patterned transparent anode 102 and a patterned transparent cathode 110 on the transparent substrate 100; forming an organic electroluminescent layer 104 on the transparent anode 102 and a electroluminescent layer 112 on the transparent cathode 110; and forming a metal cathode 106 on the organic electroluminescent layer 104 and a metal anode 114 on the electroluminescent layer 112 for forming the organic electroluminescent device 130 and the solar cell 132.

In the present invention, the organic electroluminescent device 130 and the solar cell 132 are formed on the transparent substrate 100. When the solar cell 132 is exposed to light, the photons having energy less than the band gap does not generate electron-hole. When the solar cell 132 is exposed to light, the photons having energy larger than the band gap can activate electrons jumping from valance band to conduction band and generate electrons and holes.

The solar cell 132 can generate electrical energy for driving the organic electroluminescent device 130 after exposed to light.

In addition, the present invention further comprises a driving unit 108, a transform unit 116 and a control unit 118. The driving unit 108 is coupled to the organic electroluminescent device 130, the transform unit 116 is coupled to the solar cell 132 and the control unit 118 is coupled to the driving unit 108 and the transform unit 116. When the solar cell 132 is exposed to light 122, it can transform the light into electrical energy. Then, the transform unit 116 coupled to the solar cell 132 can transport the electrical energy to the control unit 118. The control unit 118 passes the electrical energy to the driving unit 108 for electroluminescence 120.

The organic electroluminescent device 130 transforms electrical energy into light for display. In the present invention, by reversing the anode and cathode and exposing the device to light, light can be transformed into electrical energy. This method can be served by the solar cell 132 of the present invention. Therefore, the organic electroluminescent device 130 has the process and material similar to those of the solar cell 132, but has different operation from the solar cell 132.

The organic electroluminescent device having solar cells and the fabricating method therefor of the present invention integrate the organic electroluminescent device and solar cells. Because the organic electroluminescent device has the process and material similar to those of the solar cells, the present invention simplifies the manufacturing process and reduces costs thereof. Moreover, because of the assistance of the solar cells, the discharge time of battery of organic electroluminescent display is increased.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

The invention claimed is:

1. An organic electroluminescent device having solar cells, comprising:
   a transparent substrate having an electroluminescent area and an exposure area;
   the organic electroluminescent device disposed within the electroluminescent area of the transparent substrate;
   at least one solar cell disposed within the exposure area of the transparent substrate;
   a driving unit coupled to the organic electroluminescent device;
   a transform unit coupled to the solar cell; and
   a control unit coupled to the driving unit and the transform unit.

2. The organic electroluminescent device having solar cells of claim 1, wherein the organic electroluminescent device comprises, in sequence, a transparent anode, an organic electroluminescent layer and a metal cathode.

3. The organic electroluminescent device having solar cells of claim 2, wherein the transparent anode comprises indium-tin oxide or indium-zinc oxide.

4. The organic electroluminescent device having solar cells of claim 2, wherein the organic electroluminescent layer comprises a hole injection layer, a hole transporting layer, a light-emitting layer, an electron transporting layer and an electron injection layer.

5. The organic electroluminescent device having solar cells of claim 2, wherein the organic electroluminescent layer is a small molecular organic electroluminescent material or a polymer electroluminescent material.

6. The organic electroluminescent device having solar cells of claim 2, wherein the metal cathode comprises aluminum, aluminum/lithium fluorine, calcium, magnesium/silver alloy or silver.

7. The organic electroluminescent device having solar cells of claim 1, wherein the solar cell comprises, in sequence, a transparent cathode, an electroluminescent layer and a metal anode.

8. The organic electroluminescent device having solar cells of claim 7, wherein the transparent cathode comprises indium-tin oxide or indium-zinc oxide.

9. The organic electroluminescent device having solar cells of claim 7, wherein the electroluminescent layer comprises an organic material or an inorganic material.

10. The organic electroluminescent device having solar cells of claim 7, wherein the metal anode comprises aluminum, aluminum/lithium fluorine, calcium, magnesium/silver alloy or silver.

* * * * *